United States Patent
Dennis

(10) Patent No.: US 6,261,136 B1
(45) Date of Patent: Jul. 17, 2001

(54) EDGE CLIP TERMINAL

(75) Inventor: Richard K. Dennis, Etters, PA (US)

(73) Assignee: Die Tech, Inc., York Haven, PA (US)

( * ) Notice: Subject to any disclaimer, the term of this patent is extended or adjusted under 35 U.S.C. 154(b) by 0 days.

(21) Appl. No.: 09/613,260

(22) Filed: Jul. 10, 2000

Related U.S. Application Data

(63) Continuation-in-part of application No. 09/302,691, filed on Apr. 30, 1999.

(51) Int. Cl.$^7$ .............................. H01R 4/02; H01R 1/60
(52) U.S. Cl. ............................................. 439/876; 439/83
(58) Field of Search .................... 439/876, 83, 874, 439/875, 879, 78, 80

(56) References Cited

U.S. PATENT DOCUMENTS

| | | |
|---|---|---|
| 3,997,237 | 12/1976 | White . |
| 4,019,803 | 4/1977 | Schell . |
| 4,085,998 | 4/1978 | Owens . |
| 4,120,558 | 10/1978 | Seidler . |
| 4,203,648 | 5/1980 | Seidler . |
| 4,302,067 | 11/1981 | Monson et al. . |
| 4,345,814 | 8/1982 | Gutbier et al. . |
| 4,357,069 | 11/1982 | Milora . |
| 4,367,910 | 1/1983 | Seidler . |
| 4,482,197 | 11/1984 | Ouellette et al. . |
| 4,500,149 | 2/1985 | Mackay . |
| 4,502,745 | 3/1985 | Chavers et al. . |
| 4,556,276 | 12/1985 | Curtis, III . |
| 4,592,617 | 6/1986 | Seidler . |
| 4,597,628 | 7/1986 | Seidler . |
| 4,605,278 | 8/1986 | Seidler . |
| 4,679,889 | 7/1987 | Seidler ............................... 439/876 |
| 4,728,305 | 3/1988 | Seidler ............................... 439/876 |
| 4,780,098 | 10/1988 | Seidler ............................... 439/876 |
| 4,900,279 | 2/1990 | Dennis ............................... 439/876 |
| 5,015,206 | 5/1991 | Dennis ............................... 439/876 |
| 5,030,144 | 7/1991 | Seidler ............................... 439/876 |
| 5,139,448 | 8/1992 | Seidler ............................... 439/876 |
| 5,334,059 | 8/1994 | Seidler ............................... 439/876 |
| 5,411,420 | 5/1995 | Dennis ............................... 439/876 |
| 5,601,459 | 2/1997 | Seidler ............................... 439/876 |
| 5,688,150 | 11/1997 | Seidler et al. ....................... 439/876 |

Primary Examiner—Brian Sircus
Assistant Examiner—Chandrika Prasad
(74) Attorney, Agent, or Firm—Thomas Hooker, P.C.

(57) ABSTRACT

A double sided edge clip terminal for forming soldered connections with opposed contact pads on the edge of a substrate includes a pair of solder contacts each having spaced metal arms and cold extruded solder masses in the interior of the contacts between the arms. Openings are formed in the contacts between the arms to prevent wicking of molten solder along the terminal and away from the contact pads. The terminals are manufactured by extruding the solder masses through the openings and into the space between the arms and beyond the arms, without solder waste.

36 Claims, 4 Drawing Sheets

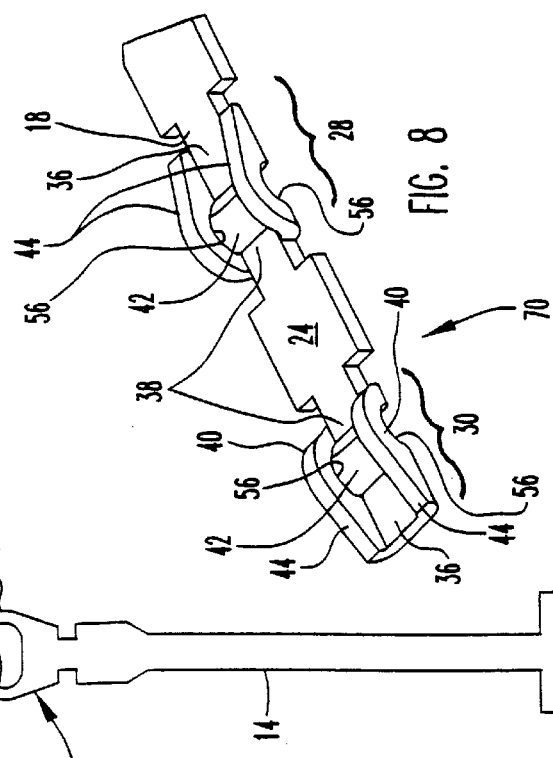
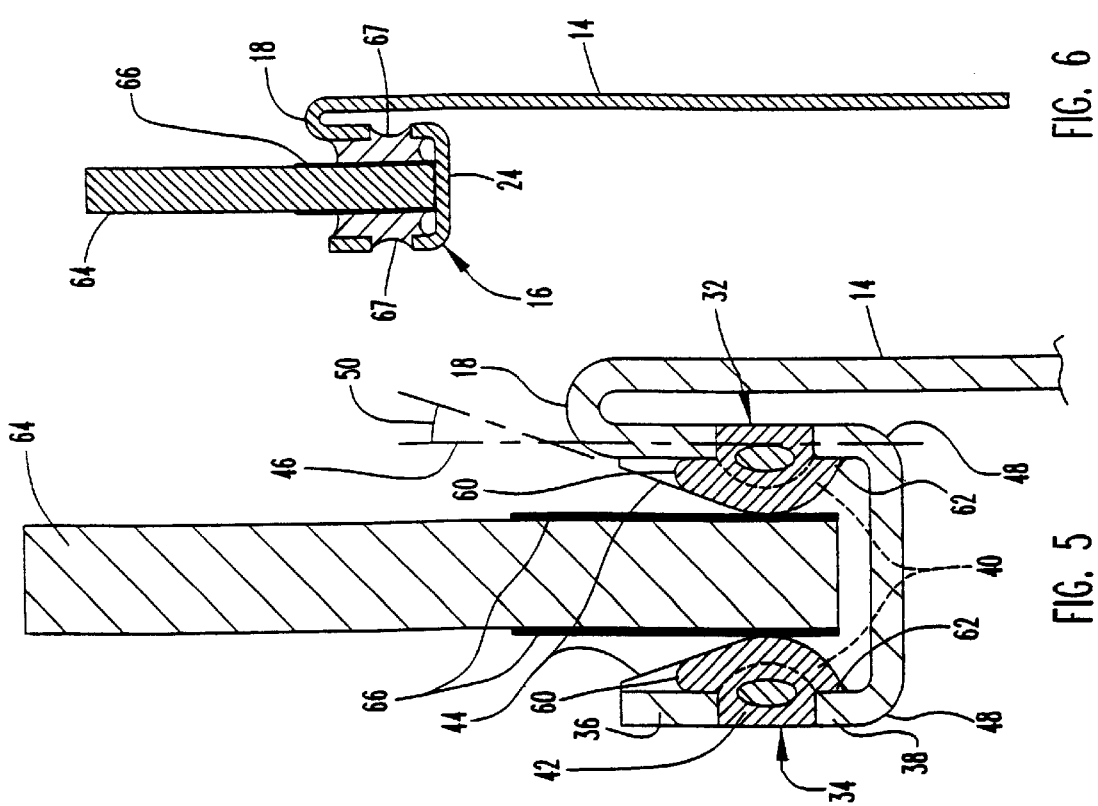

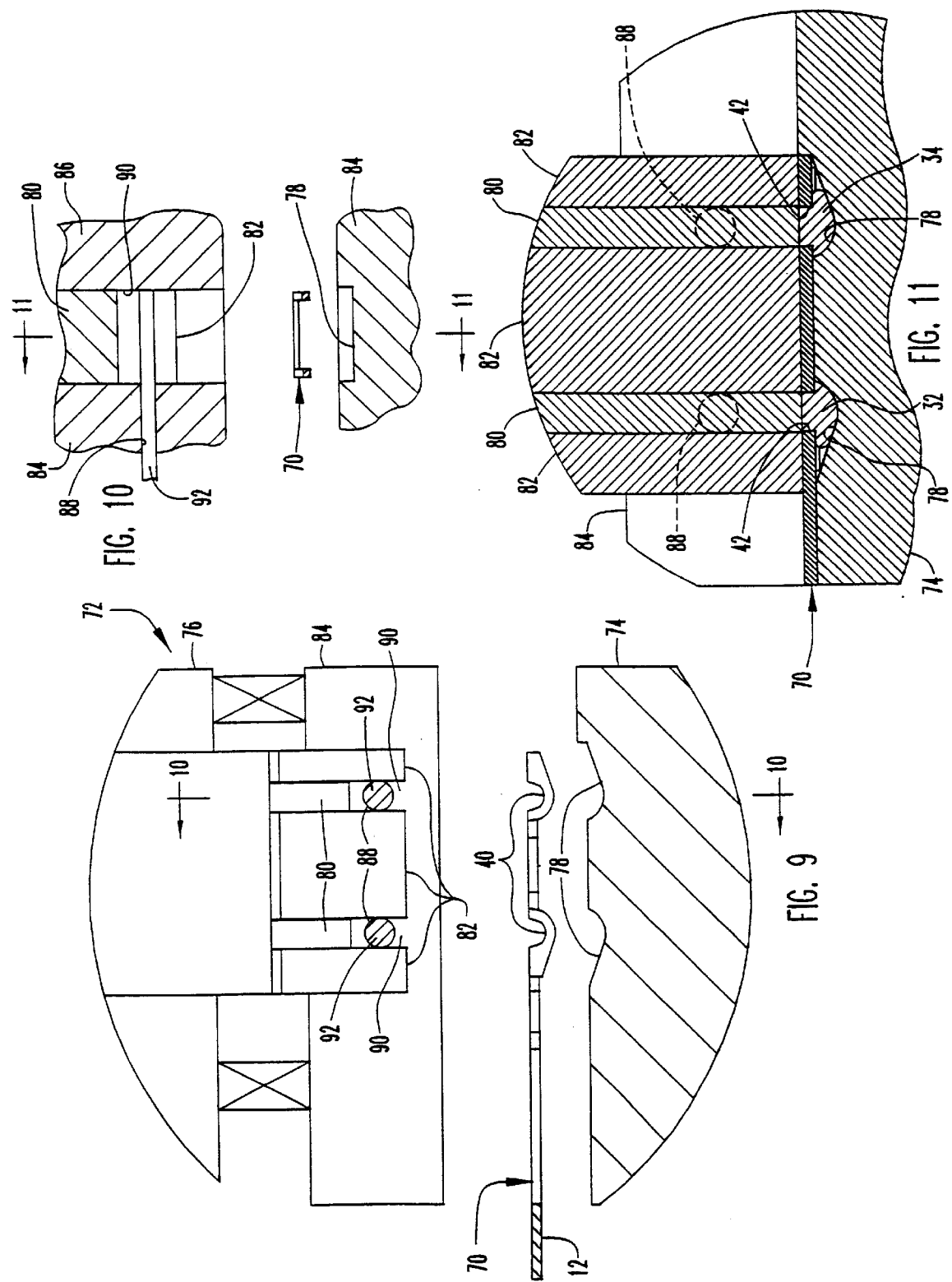

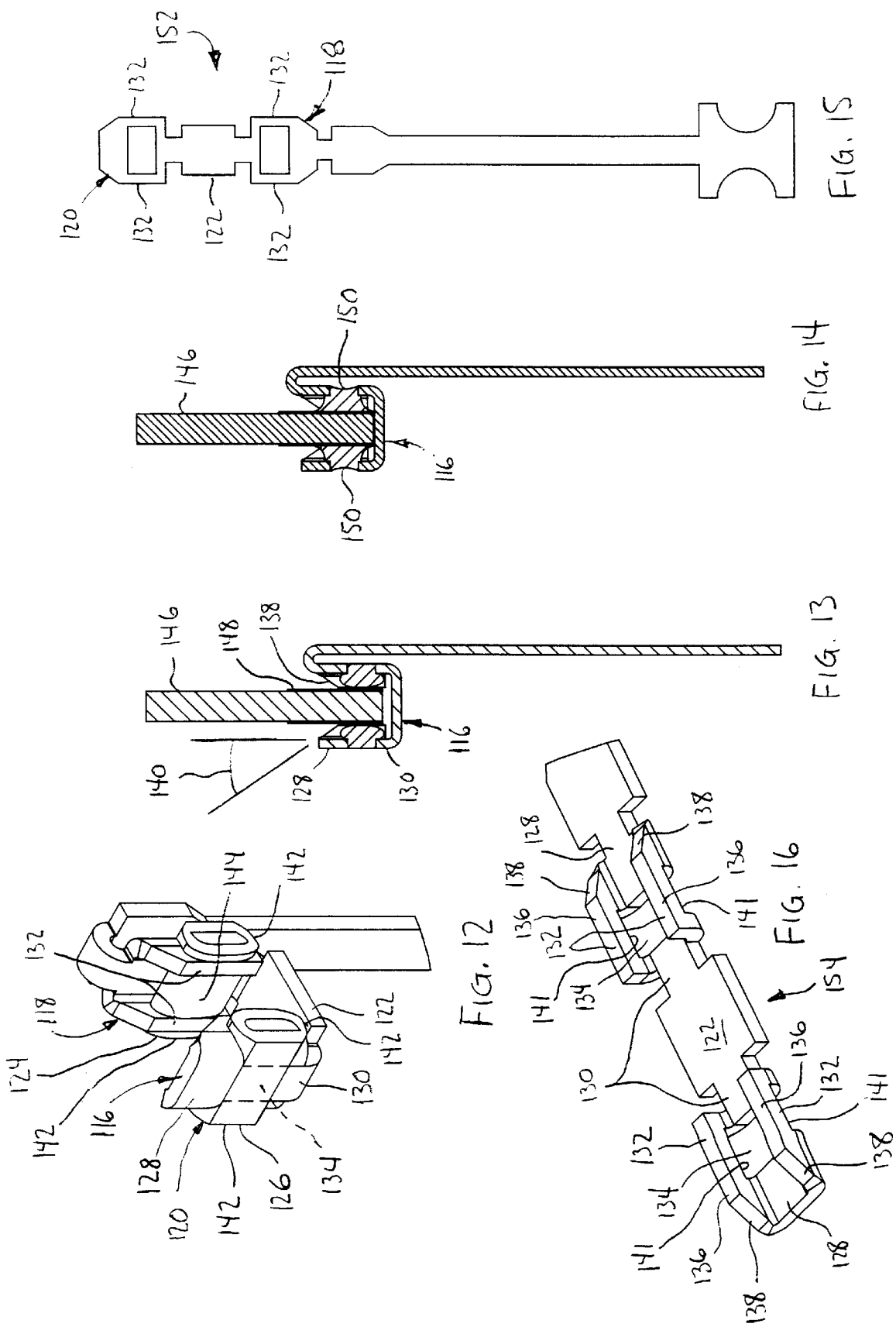

EDGE CLIP TERMINAL

This is a continuation-in-part of co-pending U.S. application Ser. No. 09/302,691 filed Apr. 30, 1999.

FIELD OF THE INVENTION

The invention relates to terminals adapted to be soldered to contact pads to form electrical connections, particularly terminals with attached solder masses. The terminal is placed in contact with a pad and heated so that the solder melts and flows into the interface between the terminal and the pad to form a soldered connection.

DESCRIPTION OF THE PRIOR ART

In the electronics industry it is conventional to mount highly miniaturized circuits on flat substrates. Electrical connections are established between the circuits and spaced pairs of contact pads extending along one or more edges of the substrate. The pads are closely spaced together in order to provide the number of electrical connections required by the circuit on the substrate. In many applications, it is desirable to attach elongate leads to each pair of opposed contact pads extending along a substrate edge. Clip type terminals may be fitted over pairs of opposed pads and then soldered to the pads.

It is now conventional to manufacture solder clip terminals with individual solder masses secured to solder contacts on opposed sides of the substrate so that after the clip is physically mounted on the substrate the soldering operation is completed by heating the clips and the solder masses to melt the solder and form reflowed solder connections with the pads. Solder clips of this type are disclosed in U.S. Pat. Nos. 4,367,910, 4,679,889 and 5,688,150.

Solder clip terminals are conventionally manufactured by stamping thin strip metal stock. The terminals include leads extending laterally from a carrier strip with clips on the ends of the leads. The leads and terminals are closely spaced along the length of the strip. Solder masses are conventionally joined to the clip terminals by extending a continuous solder wire along the terminals, parallel to the carrier strip, attaching the wire to each terminal and then severing and discarding portions of the solder wire located between adjacent terminals. The remaining sections of solder wire are attached to the terminals by bending or folding a portion of the terminal around the solder wire or by forming the severed portion of the wire around the terminal. In either case, the solder terminal is expensive to manufacture because a large percentage of the solder wire used in making the terminals is cut away and discarded.

In terminals where a portion of the terminal is wrapped around a short length of solder wire to hold the solder wire in place the solder wire does not engage the contact pad. Rather, the contact engages the pad and separates the solder a distance from the pad. In some cases, difficulty is encountered in flowing molten solder from the length of wire across the thickness of the terminal and into the interface between the pad and contact. This problem can cause a poor or failed solder connection between the terminal and the pad.

Further, reflow soldering heats the entire terminal, including the contact and the terminal tail, to a high temperature. When the solder melts the molten solder tends to wick along the heated metal and away from the contact pad, reducing the volume of solder available for establishing the desired electrical connection. This problem can result in weak or malformed soldered connections with the pads. Wicking of molten solder to a portion of the terminal away from the contact undesirably changes the dimensions of the portion and can prevent subsequent use of the portion.

In conventional solder terminals where a solder mass is held on the terminal and directly engages the contact pad when the terminal is mounted on the pad, melting of the solder mass may weaken the physical connection between the contact and the pad and permit undesired relative movement between the solder terminal and the pad.

Thus, there is a need for an improved solder terminal for forming an electrical connection with a substrate contact pad where a mass of solder is secured to the terminal, the terminal is stably mounted on the pad during soldering, both the terminal and the mass of solder engage the contact pad when the terminal is mounted on the pad and when the mounted terminal and pad are heated the solder melts and flows reliably to the connection between the terminal and the pad, without wicking along the terminal away from the pad. The terminal should be inexpensive to manufacture without solder waste.

SUMMARY OF THE INVENTION

The invention is an improved solder terminal for forming reliable soldered electrical connections with substrate contact pads. The terminal includes a solder contact with a pair of contact arms or bridges facing the pad, a pair of base members joined to the ends of the arms and a gap between the base members. One of the base members is attached to a lead extending away from the terminal for forming an electrical connection with another circuit element. A mechanically formed solder mass is extruded into the contact through the gap, fills the space between the arms and extends outwardly beyond the arms. The shape of the solder mass conforms to the shape of the arms.

The contact is soldered to a pad by placing the arms in engagement with the pad and then heating the terminal and the pad. Heating melts the solder, which includes resin as a flux. The molten solder flows onto the pad and around the arms to form a reliable solder connection. During soldering the arms are maintained in contact with the pad and the contact is stable. The opening between the base members prevents molten solder from wicking away from the contact and along the lead to reduce the volume of solder available at the solder connection and alter the shape of the lead.

The solder contacts are preferably used in double sided edge clip terminals and engage opposed pairs of contact pads on the edge of a substrate. Insertion of a clip onto the edge of a substrate stresses the clip slightly to form a physical connection between the clip and the pads. This connection is maintained during soldering, and assures that the terminal is held tightly in place until the reflowed solder cools and solidifies. The spaced arms engage the pads and hold the terminal stably in place without pivoting or wobbling during soldering.

The solder terminal is manufactured by cutting successive slugs of solder from the ends of solder wires and cold flowing the slugs through the gaps or openings between the base members in the two contacts and into the space between and to either side of the arms, without waste of solder. The cost of manufacturing the terminal is reduced.

Other objects and features of the invention will become apparent as the description proceeds, especially when taken in conjunction with the accompanying drawings illustrating the invention, of which there are four sheets and two embodiments.

DESCRIPTION OF THE DRAWINGS

FIG. 5 is a sectional view showing the edge clip terminal of FIG. 2 mounted on an edge of a substrate before soldering;

FIG. 6 is a view like FIG. 5 after reflow soldering of the terminal to a substrate;

FIG. 7 is a top view of a stamped preform for forming the edge clip terminal of FIG. 2;

FIG. 8 is a perspective view of the preform shown in FIG. 7 after upward folding of arms;

FIG. 9 is a view showing tooling for forming solder masses on the preform of FIG. 8;

FIG. 10 is a sectional view taken along line 10—10 at FIG. 9;

FIG. 11 is a sectional view taken along line 11—11 of FIG. 10 showing forming of the solder masses;

FIG. 12 is a view like FIG. 4 of a second embodiment edge clip terminal;

FIG. 13 is a sectional view showing the edge clip terminal of FIG. 12 mounted on an edge of a substrate before soldering;

FIG. 14 is a view like FIG. 13 after reflow soldering of the terminal to a substrate;

FIG. 15 is a top view of a stamped preform for forming the edge clip terminal of FIG. 12; and FIG. 16 is a perspective view of the preform shown in FIG. 15 after upward folding of arms.

DESCRIPTION OF THE PREFERRED EMBODIMENTS

Figures 1, 2, 3, 4:
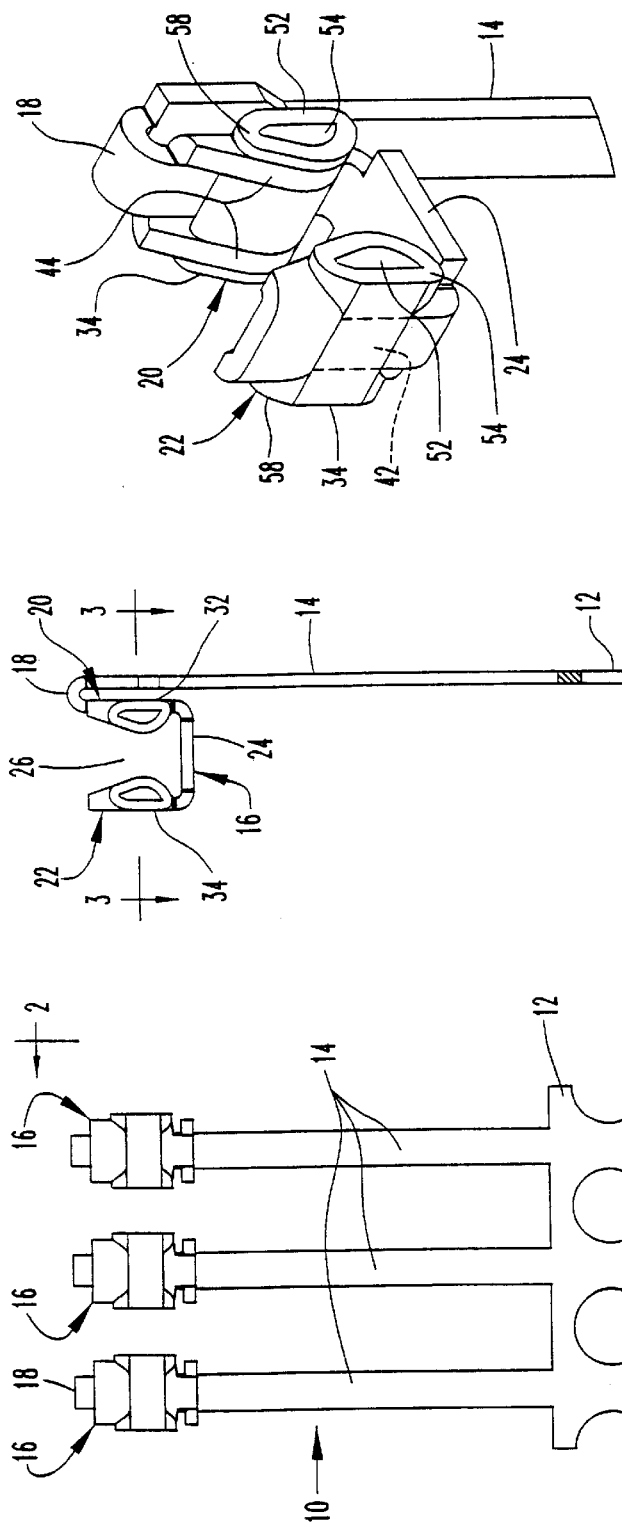
FIG. 1 is a view of a plurality of first embodiment edge clip terminals on a carrier strip.
FIG. 2 is a side view of one of the terminals shown in FIG. 1 taken along line 2—2 of FIG. 1.
FIG. 3 is an enlarged sectional view taken along line 3—3 of FIG. 2.
FIG. 4 is a perspective view of the edge clip terminal shown in FIG. 2.

FIGS. 1 and 2 illustrate a carrier strip assembly 10 stamp-formed from thin uniform thickness metal stock and including a continuous carrier strip 12, a plurality of spaced, parallel leads 14 extending to one side of the strip and first embodiment double sided edge clip terminals 16 on the ends of the leads away from the strip. Each terminal 16 is joined to the end of a lead 14 by a 180 degree bend portion 18 to offset the terminals 16 to one side of leads 14 as shown in FIG. 2.

Each terminal 16 includes a pair of opposed solder contacts 20 and 22 which are joined together by flat base 24. Contacts 20 and 22 extend upwardly from the ends of the base 24 to define a U-shaped clip having a mouth 26 opening away from the carrier strip 12. The mouths 26 of adjacent terminals are aligned along the length of the strip to facilitate simultaneous mounting of a number of terminals on contact pads extending along an edge of a substrate.

The like solder contacts 20 and 22 each include a metal portion or body 28, 30, shown in FIG. 8, formed from flat strip stock, and a solder mass 32, 34 formed around and joined to the metal portion. Each of the metal portions 28 and 30 includes a pair of flat, parallel base members or rungs 36 and 38 which are joined together by a pair of laterally spaced and inwardly curved contact arms or bridges 40. The convex contact arms extend above and to one side of the base members. The base members of each contact are spaced apart by a gap or opening 42 and lie in a plane. The arms extend away from the plane 46 at 90 degrees and into mouth 26. The arms 40 span the openings or gaps 42 between the base members 36 and 38.

The metal portions 28 and 30 of the solder contacts shown in FIG. 8 are folded up 90 degrees from base 24 at corners 48 with the arms 40 facing each other, reducing the width of terminal mouth 26 and extending into the clip. The inner surfaces 44 of the arms, adjacent the top of the mouth, have a gradual taper to facilitate mounting the clips on an edge of a substrate. Surfaces 44 extend at a shallow angle 50 of 20 degrees from plane 46 of the base members, as shown in FIG. 5.

Solder masses 32 and 34 are preferably mechanically formed from short lengths or slugs of rosin core solder wire. The rosin serves as a flux during soldering. The solder lengths are cold flowed around the arms and base members of the metal portions 28 and 30 to secure the solder masses in place on the metal portions and provide large volumes of solder and rosin immediately adjacent the contact pads of a substrate extended into the clip. In this way, melting of the solder masses forms reliable soldered electrical connections between the solder contacts and pads on the substrate. Each solder mass 32, 34 includes an outer solder sheath 52 surrounding a central rosin core 54.

As illustrated best in FIGS. 3, 4 and 5, each integral mechanically formed solder mass 32, 34 fills an opening 42 and is flush with the outer surfaces of base members 36 and 38. The solder mass also fills the arcuate spaces 56 under arms 40, shown in FIG. 8, and extends laterally outwardly beyond the two arms 40. The end portions 58 of the solder mass are located outwardly of the arms 40 and contact the outer surfaces of the arms as shown in FIG. 3. The solder mass fills the interior space between the arms and above the base members 36 and 38 and opening 42. Each solder mass includes an outer extension 60 contacting the inside of base member 36 and extending between the arms and an inner extension 62 contacting the inside of base member 38 and extending between the arms. As shown in FIG. 5, the inner surfaces of the solder masses facing the mouth 26 conform to the contact surfaces 44 of arms 40 to engage contact pads of a substrate in mouth 26. The end portions 58 of the solder masses also include outer and inner extensions like extensions 60 and 62 conform to the inner surfaces of arms 40, as illustrated best in FIG. 4.

The mechanically formed solder masses 32, 34 are held in place on the terminal metal portions 28, 30 by the outer and inner extensions 60, 62 which abut the adjacent base members and the inner sides of the arms to prevent movement of the solder masses outwardly of the contact through gaps 42 or laterally of the contacts. The portions of the solder masses filling the arcuate spaces 56 under the arms prevent the solder masses from moving inwardly of the metal portions, into the interior of the clip terminals. The end portions 58 of the solder masses also prevent lateral movement and movement into the clip terminal.

Double sided edge clip terminals 16 are mounted on the edge of a substrate 64 as shown in FIG. 5. The substrate may be a ceramic substrate, a phenolic substrate or a metal substrate having insulating coatings. Spaced pairs of contact pads 66 extend along both sides of the substrate at the edge facing the terminals. The clip terminals 16 are spaced along carrier strip 12 so that each of the terminals engages a pair of opposed pads on the substrate as illustrated. The terminals 16 are manufactured with a minimum spacing between the solder contacts 20 and 22 slightly less than the spacing between the pads 66. During insertion of the terminals on the substrate the edge of the substrate is guided into the terminal mouths 26 by the shallow sloped inner surfaces 44. The solder contacts are spread apart a slight distance to assure pressure engagement is maintained between the terminals and the pads before and during soldering. The spaced arms on each solder contact stabilize the terminal on the substrate in desired locations on the pads, without wobble before and during soldering. The inner surfaces of the solder masses are very close to and preferably engage pads 66. If desired, the inner surfaces of the solder masses may be crowned slightly to assure wiped contacts are formed between the pads and the solder masses during insertion of the terminals on the substrate.

Following mounting of terminals 16 on the substrate as described, the terminals are heated to melt the solder masses and form reliable reflow solder connections between the two solder contacts 20 and 22 and pads 66, as shown in FIG. 6. The large volume of solder in each of the solder masses is heated, melts and flows into the space between the pads and the base members 36 and 38 and around the arms. During soldering, the metal portions and the solder masses in the terminals and the contact pads are all heated to a high temperature. Molten solder flows along the heated metal surfaces to the pads and forms strong reliable solder joints between the terminals and the pads.

In conventional solder clips having a continuous metal portion overlying a contact pad, heating of the terminal for soldering also promotes wicking of molten solder along the terminal and away from the solder joint. Removal of available solder from the solder joint by wicking reduces the volume of solder available for forming the solder joint, weakens the joint and can result in a failed solder joint. Further, after cooling of the terminal the solder wicked away from the joint solidifies on the terminal remote from the contact pads. This wicked solder undesirably changes the shape of the terminal and can prevent the terminals from being used as intended. For instance, enlarged terminal leads may not fit into connector blocks as intended and may not establish electrical connections with other circuit elements as intended.

Openings 42 are provided in each solder contact 20, 22 above the substrate pads. When the solder bodies are melted the molten solder has limited contact with the metal portions of the contacts and is drawn to and wicks along the pads 66. No solder is provided on the base members outside of the openings. Openings 42 prevent hot molten solder from wicking along the hot surfaces of the metal portions. The solder is drawn to the pads and to arms 40 contacting the pads to form large area, large volume reliable solder joints between the pads and the contacts. The drawing of the molten solder to the pads and arms and away from the base members forms recesses 67 in the solder in openings 42. The retention of molten solder in the solder contacts assures that the leads 14 are not enlarged by wicked solder.

Double sided edge clip terminals 16 are preferably formed from thin, uniform thickness stock, which may have a minimum thickness from 0.006 to 0.010 inch. The terminals 16 may have a minimum spacing from 0.100 inch to 0.050 inch along carrier strip 12. The leads and metal portions are formed by stamping with perpendicular cut edges extending between opposite sides of the strip, as illustrated in FIGS. 3 and 5.

FIGS. 7–11 illustrate manufacture of assembly 10. FIG. 7 illustrates a flat stamped contact preform 68 located on the end of a lead 14 on carrier strip 12. The preform includes base 24 and the two metal portions 28 and 30 with the arcuate arms 40 lying in the plane of the preform. After stamping of the preform 68 the arms 40 are bent up 90 degrees to form preform 70 shown in FIG. 8.

The solder masses are secured to the FIG. 8 preform 70 using tooling as shown in FIGS. 9, 10 and 11. The tooling 72 includes anvil 74 and a ram 76 located above the anvil. The ram is vertically moveable toward and away from the anvil and may be driven by a conventional crank-type punch press. A pair of spaced solder forming grooves 78 are formed in the upper surface of anvil 74. Preform 70 is placed on anvil 74 with the downwardly extending arms 40 in the grooves 78. The grooves are shaped so that when the preform rests flat on the anvil the bridge surfaces 44 rest flush on the bottoms of the grooves. As illustrated in FIG. 10, the grooves have a length wider than the width of the preform 70 at arms 40 and equal to the total width of the solder masses 32 and 34 when joined to the preform. The preform is positioned centrally so that the arms are located equidistant from the ends of the grooves 78.

Ram 76 carriers a pair of solder punches 80 located above grooves 78 and having a width equal to the length of the grooves 78, as shown in FIG. 10. Spring backed hold down blocks 82 are located to either side of the solder punches 80 and normally extend below the punches. The hold down blocks have the same width as punches 80. The punches and hold down blocks are located between a pair of side plates 84 and 86, which are spring mounted on ram 76. A pair of solder feed passages 88 extend through plate 84 and open into the recesses 90 located between the lower ends of punches 80 and the hold down blocks 82 when located above anvil 74. Solder wires 92, of the type previously described, are fed through the passages 88 and into the recesses 90 until the lead ends of the wires engage plate 86, as shown in FIG. 10.

With preform 70 positioned on the top of anvil 74 and arms 40 located in grooves 78, the ram 76 is lowered. During lowering, the plates 84 and 86 engage the anvil to either side of the preform and are held against the anvil. Continued lowering moves the hold down blocks 82 into engagement with the upper surfaces of preform 70 to firmly hold the preform against the anvil with the arms in grooves 78. Continued lowering of the ram collapses the hold down blocks and moves punches 80 down against the ends of the solder wires 92 extending between plates 84 and 86 and severs the ends of the soldering wire from the remainder of the wire in passages 88. The severed ends or slugs of the solder wire are driven down by the punches and are cold flowed through the openings 42 in the preform, through the gaps between the preform arms and the ends of the grooves 78 and into spaces 56 to form the solder masses 32 and 34 as previously described. FIG. 11 illustrates that the solder flowed through the openings 42 is extruded along the preform to form extensions 60 and 62 under base members 36 and 38.

FIG. 11 illustrates the position of the tooling when the ram 76 has fully bottomed. The lower ends of punches 80 are flush with the upper surface of the preform 70 and the two slugs of solder cut from the lead ends of wires 92 have been cold flowed through and around the arms to form the solder masses. The slug of solder wire is extruded down through the gap and between and around the two arms to form the solder mass. The solder mass mechanically joins the arms without forming a solder layer on the inner contact surfaces 44 of arms 40. When the clips are mounted on the substrate the contact surfaces of the arms engage the contact pads directly and are not separated from the pads by solder.

Manufacture of the terminal 16 is completed by raising the ram back to the positioned of FIG. 9, removing the preform 70 and attached solder masses from between the ram and anvil and then forming the 180 degree bend 18 and 90 degree bends at corners 48. When the ram is raised solder wire feeds (not illustrated) advance solder wires 92 through recesses 90 and against plate 86 to prepare the anvil for the next cycle of operation.

FIG. 12 illustrates a second embodiment double sided edge clip terminal 116. The terminal 116 is identical to terminal 16 except for the contact arms and the shape of the solder masses. Terminal 116 includes a pair of opposed solder contacts 118 and 120 joined by a flat base 122. The like solder contacts 118 and 120 each include a solder mass 124, 126 formed from rosin core solder wire and a pair of spaced apart base members or rungs 128 and 130, like base members 36 and 38 of terminal 16.

The base members 128 and 130 are joined together by a pair of laterally spaced, straight contact arms or bridges 132 that span the openings 134 between the base members. The arms 132 are located above and to one side of the base members. In terminal 116, the arms of each contact face each other with planar inner surfaces 136 located in the clip. The inner surfaces 136 of the arms of each contact parallel each other and lie in a common plane parallel to the base members 128 and 130. The ends of the arms adjacent the top or mouth of the clip have bevels 138 that facilitate mounting the clips on the edge of the substrate. The bevels 138 extend at a shallow angle 140 of about 35 degrees from the plane of the base members as shown in FIG. 13.

Solder masses 124 and 126 are similar to solder masses 32 and 34 of clip 16 and are cold flowed through openings 134 and around the arms 132 and base members 128 and 130. Each solder mass 124, 126 fills the space 141 under the arms 132 and extends laterally outwardly beyond the two arms 132. End portions 142 of the solder mass are located outwardly of the arms 132 and contact the outer surfaces of the arms 132. Each solder mass includes outer and inner extensions, like extensions 60 and 62 of solder mass 34. As shown in FIG. 13, the surfaces of the solder masses facing the clip mouth extend from the base members inwardly to planar top surfaces 144 that lie in the planes of arm inner surfaces 136. These surfaces engage contact pads of a substrate inserted in the clip. Solder mass ends 142 also have tope surfaces that lie in the same planes, as best illustrated in FIG. 12.

FIG. 13 illustrates terminal 116 mounted on the edge of a substrate 146 and engaging contact pads 148. For clarity, the solder masses are shown as homogeneous members. During insertion of the terminal, the shallow bevels 138 guide the edge of the substrate into the terminal mouth and the solder contacts are spread apart slightly to engage the terminals and pads before and during soldering. The flat contact surfaces 136 support the substrate and prevent wobble before and during soldering. The inner surfaces 144 of the solder masses are very close to and preferably engage the pads 148. If desired, the solder mass surfaces 144 may be crowned slightly to assure wiped contacts are formed between the pads and the solder masses.

FIG. 14 illustrates reflowed solder connections between the solder contacts and the substrate pads. Molten solder flows along the heated metal surfaces to the pads without wicking away from the joint to form recesses 150, like recesses 67 on terminal 16, to assure strong reliable solder joints between the terminals and the pads.

FIG. 15 illustrates a flat stamped contact preform 152 located on the end of a lead on a carrier strip for forming clip 116. The preform 152 is identical to preform 68 except for contact arms 132. After stamping of the preform 152 the arms 132 are bent up 90 degrees to form preform 154 shown in FIG. 16. Solder masses are extruded through openings 134 and into the solder contacts as previously described in the manufacture of the first embodiment terminal using tooling shown in FIGS. 9–11. The clip 116 is then formed from the preform as described in forming clip terminal 16.

While I have illustrated and described preferred embodiments of my invention, it is understood that this is capable of modification, and I therefore do not wish to be limited to the precise details set forth, but desire to avail myself of such changes and alterations as fall within the purview of the following claims.

What I claim as my invention is:

1. A contact for forming a soldered electrical connection with a pad, the contact comprising an integral metal body having two base members spaced apart from each other and a pair of laterally separated arms extending between the base members, said base members and arms defining an opening in the metal body, a pad-engaging surface on each arm, said surfaces located to one side of the base members and facing away from the base members; and a solder mass in the opening, the solder mass extending between the separated arms and contacting the arms adjacent the surfaces.

2. A contact as in claim 1 wherein the pad-engaging surfaces of the arms are flat or curved.

3. The contact of claim 2 wherein said members lie essentially in a common plane, and the arms extend to one side of the plane.

4. The contact of claim 1 wherein the pad-engaging surfaces are flat and essentially parallel said members.

5. The contact of claim 3 wherein said solder mass includes a first portion overlying and engaging one of said members.

6. The contact as in claim 5 wherein said solder mass includes a second portion overlying and engaging the other said members.

7. The contact as in claim 6 wherein said solder mass portions engage the sides of said members adjacent the arms.

8. The contact as in claim 6 wherein said solder mass fills the opening and is flush with the members on the side of the members away from the arms.

9. The contact of claim 2 wherein said solder mass fills the opening and includes a surface that conforms essentially to at least a portion of said pad-engaging surfaces.

10. The contact as in claim 2 including a space under each arm, said solder mass extending into said spaces.

11. The contact as in claim 10 wherein the solder mass includes portions located outwardly of said arms.

12. The contact as in claim 1 wherein said solder mass comprises a length of solder wire including solder and a rosin flux, said length of solder wire extruded into said opening.

13. A solder clip terminal including a pair of claim 1 contacts and a base, the metal body of each contact integrally joined to the base at a bend so that each contact extends generally perpendicularly away from the base to define a clip having a mouth, said arms facing into the interior of the clip, and a lead joined to one of said metal bodies.

14. A terminal as in claim 13 wherein said lead extends along one of said contacts outside of the clip and including a reverse bend joining the lead to such one contact.

15. A terminal as in claim 13 including surfaces on the arms adjacent the clip mouth, said surfaces sloping at a shallow angle to facilitate positioning of the clip terminal on the edge of a substrate.

16. A terminal as in claim 15 wherein said angle is not greater than about 35 degrees.

17. An edge clip terminal for forming a soldered connection with a substrate pad, the terminal including a metal body having a base and opposed side bodies extending away from the base, one of the said side bodies comprising a pair of spaced base members, a gap separating the base members, and a pair of elongate arms joining the base members and extending across the gap, said arms facing the interior of the clip and including inner pad contact surfaces; and a mechanically formed solder mass on the one side body, said solder mass extending between and engaging the arms, and having a surface facing the interior of the clip, said surface conforming generally to the inner pad contact surfaces of the arms.

18. The terminal as in claim 17 wherein said solder mass fills the gap and engages the base members.

19. The terminal as in claim 18 wherein said solder mass includes portions overlying the arms on the inside of the clip.

20. The terminal as in claim 18 wherein the solder mass includes portions extending under the arms.

21. The terminal as in claim 20 wherein said solder mass includes portions overlying the sides of the base members facing the interior of the clip.

22. The terminal as in claim 20 wherein said base members lie generally parallel to a common plane and said arms include lead in surfaces.

23. The terminal as in claim 17 wherein said solder mass is flush with the outer surfaces of said base members.

24. The terminal as in claim 17 wherein said arms are located at the lateral edges of said base members and extend into the clip at generally 90 degrees to the base members.

25. The terminal as in claim 17 wherein the outer surfaces of the arms are either flat or curved.

26. The terminal as in claim 17 wherein the solder mass includes a resin core.

27. The terminal as in claim 17 wherein said solder mass comprises a slug of rosin core solder wire cold flowed into the gap.

28. A contact for forming a soldered electrical connection with a pad, the contact comprising an integral metal body having two co-planar base members spaced apart from each other and a pair of laterally separated arms extending between the base members, said base members and arms defining an opening in the metal body, a pad-engaging surface on each arm, said surfaces located to one side of the base members and facing away from the base members; and a cold flowed solder mass filling the opening, the solder mass including a solder surface extending between the arms and conforming to the pad-engaging surfaces on the arms.

29. A contact as in claim 28 wherein the solder surface extends a slight distance above the pad-engaging surfaces.

30. A contact as in claim 28 wherein the arms are straight or curved.

31. A contact as in claim 28 wherein the pad-engaging surfaces are essentially parallel with the base members.

32. The contact of claim 1 wherein the pad-engaging surfaces are curved.

33. The contact of claim 1 wherein the arms are elongate and extend parallel to each other.

34. The contact of claim 33 wherein the opening is rectangular.

35. The contact of claim 1 wherein the solder mass includes a first cold flowed portion engaging a first arm and a second cold flowed portion engaging a second arm.

36. The contact of claim 35 wherein the solder mass substantially fills the opening between the arms.

* * * * *